US006447898B1

(12) United States Patent
Pfaff

(10) Patent No.: US 6,447,898 B1
(45) Date of Patent: Sep. 10, 2002

(54) ELECTRICALLY CONDUCTIVE, THERMOPLASTIC, HEAT-ACTIVATABLE ADHESIVE SHEET

(75) Inventor: Ronald Pfaff, Hamburg (DE)

(73) Assignee: tesa AG, Hamburg (DE)

( * ) Notice: Subject to any disclaimer, the term of this patent is extended or adjusted under 35 U.S.C. 154(b) by 0 days.

(21) Appl. No.: 09/440,337

(22) Filed: Nov. 15, 1999

(30) Foreign Application Priority Data

Nov. 21, 1998  (DE) .......................................... 198 53 805

(51) Int. Cl.$^7$ ................................................. B32B 7/12
(52) U.S. Cl. .................... 428/346; 428/347; 428/355 R; 428/355 EP; 428/355 EN; 428/355 CN; 428/402; 428/403; 428/406
(58) Field of Search ................................ 428/346, 347, 428/355 R, 355 EP, 355 EN, 355 CN, 402, 403, 406

(56) References Cited

U.S. PATENT DOCUMENTS

| 3,475,213 A | 10/1969 | Stow |
| 4,606,962 A | 8/1986 | Reylek et al. |
| 5,300,340 A | 4/1994 | Calhoun et al. |

FOREIGN PATENT DOCUMENTS

EP  0842995  5/1998

OTHER PUBLICATIONS

English–language abstract of German application No. DE 195 19 499, the German equivalent of EP0842995.

*Primary Examiner*—Duc Truong
(74) *Attorney, Agent, or Firm*—Norris McLaughlin & Marcus

(57) ABSTRACT

Electrically conductive, thermoplastic and heat-activatable adhesive sheet comprising i) a thermoplastic polymer in a proportion of at least 30% by weight,
ii) one or more tackifying resins in a proportion of from 5 to 50% by weight and/or
iii) epoxy resins with hardeners, with or without accelerators, in a proportion of from 5 to 40% by weight,
iv) metallized particles in a proportion of from 0.1 to 40% by weight,
v) non-deformable or virtually non-deformable spacer particles, in a proportion of from 1 to 10% by weight, which do not melt at the bonding temperature of the adhesive sheet.

17 Claims, No Drawings

ELECTRICALLY CONDUCTIVE, THERMOPLASTIC, HEAT-ACTIVATABLE ADHESIVE SHEET

The invention describes an electrically conductive, thermoplastic and heat-activatable adhesive sheet as used for the permanent connection of two articles.

Electronic components are becoming ever smaller, which makes their handling and processing ever more difficult. Especially when producing electrical contacts between the components and/or the connections, it is found that conventional soldering can no longer provide simple and cost-effective connection of the corresponding contacts. The adhesive bonding of electronic components by means of electrically conductive layers of adhesive is an alternative.

For the field of electrically conductive adhesive tapes it is known to employ conductive pigments such as carbon black, metal powders, ionic compounds and the like in adhesive compositions. In sufficient quantities, the particles contact one another and the possibility of current flow from particle to particle is provided. The current flow here is not directionally oriented (isotropic).

For specific applications, such as electronic switches, contacting of conductors, etc, there is, however, the requirement to achieve electrical conductivity only in the depth direction (z direction) through the adhesive tape, with no conductivity, however, in the two-dimensional extent (x-y plane) of the adhesive layer.

In special cases, it is also required and must be ensured that the conductive sites through the adhesive layer (in the z direction)

- are distributed homogeneously, so that any sites on the adhesive tape can be used identically and lead to the same results;
- have small cross-sections, so that even in the electronics sector conductor tracks lying close together can be selectively connected without the risk of short circuits; and
- are insulated from one another, in that the areas in between are filled with non-conductive materials.

U.S. Pat. No. 3,475,213 describes randomly distributed spherical particles in a self-adhesive composition, which consist entirely of a conductive metal or are provided with an electrically conductive layer. The best results are obtained with particles which are only slightly smaller than the thickness of the layer of adhesive composition.

In U.S. Pat. No. 5,300,340, a special production method using a rotating drum is employed to site the electrically conductive particles in the adhesive composition, the particles being slightly larger than the thickness of the film of adhesive composition.

The solutions described above firstly reduce the bond strength and secondly distance the adhesive tape from the surface, since the particles protrude to a certain extent from the surface, which is disadvantageous to the bond strength but entirely desirable for improving the electrical conductivity.

U.S. Pat. No. 4,606,962 is concerned to improve the electrical contact. It describes how the use of soft, spherical particles instead of spherical, silverized glass beads permits permanent electrically conducting contacts through the layer of adhesive composition. The reason given for this is that the soft particles, which are no harder than pure silver at the activation temperature of the adhesive, flatten under stress against the contact faces and so increase the contact surface area.

In trials it has been possible to show that protruding particles always lead to unwanted air inclusions in the bonded joint, which reduces the strength of the bond perceptibly and results in a situation where, under mechanical stress in an elastic bonded joint, the particles lose contact, which can only be re-established by applying pressure again.

Particularly in the case of electronic devices which are small and flexible, as are used in an electronic toy or in chip cards, the electrically conducting adhesive bond is frequently not protected by a rigid casing and is required to withstand flexural stresses without losing the electrical contact.

In the processes presented above, therefore, either the bond strengths are inadequate for electrical contacts placed under mechanical stress, or there is no permanently secure electrically conducting contact.

DE 195 19 499, furthermore, discloses a thermoplastic adhesive sheet for implanting electrical modules in a card body which is provided with a recess intended to accommodate an electronic module which has on its first side a plurality of contact faces and on its second side, which is opposite to the first side, an IC chip whose terminals are connected via electrical conductors to the contact faces, the adhesive sheet being used to connect the second side of the module to the card body. The adhesive sheet has the combination of the following components:

i) a thermoplastic polymer in a proportion of from 50 to 100% by weight, plus ii) one or more tackifying resins in a proportion of from 0 to 50% by weight, or, alternatively, iii) epoxy resins with hardeners, in a proportion of from 0 to 40% by weight.

The object of the invention is to achieve an effective and permanent bond while simultaneously producing an electrically conductive contact in the case where a carrier element in data carriers or electronic components is bonded with the aid of a heat-activatable adhesive layer.

This object is achieved by means of an adhesive sheet as characterized further in the main claim. The subclaims relate to advantageous developments of the subject matter of the invention.

In accordance with the invention, the electrically conductive, thermoplastic and heat-activatable adhesive sheet comprises i) a thermoplastic polymer in a proportion of at least 30% by weight, ii) one or more tackifying resins in a proportion of from 5 to 50% by weight and/or iii) epoxy resins with hardeners, with or without accelerators, in a proportion of from 5 to 40% by weight, iv) metallized particles in a proportion of from 0.1 to 40% by weight, with particular preference 10% by weight, v) non-deformable or virtually non-deformable spacer particles, in a proportion of from 1 to 10% by weight, which do not melt at the bonding temperature of the adhesive tape.

The adhesive sheet preferably has a thickness of from 10 to 500 $\mu$m.

The adhesive sheet is a mixture of reactive resins which crosslink at room temperature and form a three-dimensional polymer network of high strength, and permanently elastic elastomers, which act against embrittlement of the product and so allow the product to withstand permanent stresses (compression, extension).

The elastomer comes preferably from the group consisting of the polyolefins, polyesters, polyurethanes and polyamides or else can be a modified rubber such as, for example, nitrile rubber, or else polyvinyl butyral, polyvinyl formal, polyvinyl acetate, or carboxylated or epoxidized SEBS polymer.

The chemical crosslinking reaction (on the basis of epoxies or phenolic resin condensation) of the resins at elevated temperature brings about high strengths between the adhesive film and the surface to be bonded, and achieves a high internal strength in the product.

The addition of the reactive resin/hardener systems also leads to a reduction in the softening temperature of the abovementioned polymers, which has the advantageous effect of reducing their processing temperature and processing rate. The suitable product is a product which is self-adhesive at room temperature or slightly elevated temperature. When the product is heated, there is a short-term reduction in the viscosity, as a result of which the product is even able to wet rough surfaces.

By means of the appropriate mixture of resins/hardener systems and the polymers, a characteristic is obtained which enables the thickness of the layer of adhesive composition to be changed significantly in the course of adhesive bonding under pressure and heat. For example, it is easy to produce an approximately 45 µm thick bonded joint using an approximately 65 µm thick product. The "excess" adhesive composition in this case is displaced, which is taken into account in the construction of the adherends or in the formulation of the adhesive. In the case of chip cards, for example, the adhesive composition can easily escape into the adjacent cavity below the module.

There is wide scope for varying the compositions of the adhesive sheet by altering the nature and proportion of the starting materials. Similarly, it is possible to obtain further product characteristics, such as colour, thermal conductivity or electrical conductivity, for example, by means of targeted additions of colourants, mineral and/or organic fillers, for example silica, and/or powders of carbon and/or of metal.

The soft conductive particles present in the adhesive sheet permit conductivity only in the z direction; in the x-y plane, owing to the lack of mutual contact, there is no conductivity. The softness of the particles causes them to flatten against the contact faces facing the substrates, which increases the contact area, and to be able to adapt to mechanical stress.

Under extension, compression and flexure, electrically conductive particles which are too hard result in detachment of the adhesive film from the substrate in the vicinity of the particles, and the particles then lose contact. It is particularly advantageous, therefore, to use soft or elastic, spherical, metallized particles whose core consists of metal or plastic and which are able to conform to the thickness of the film of adhesive composition after applying pressure, since the core is able to deform at the bonding temperatures. These particles can be metal beads—made, for example, of gold, nickel or silver; silverized metal beads or, preferably, metallized or metal-coated polymer or elastomer beads, such as plastic beads, Styropor beads, coating being carried out with a highly conductive metal (gold, silver, copper, nickel). Furthermore, the metal or plastic beads may be coated with conductive polymer.

The diameter of the metallized particles is preferably below the thickness of the film of adhesive composition, and the particles are preferably harder than the adhesive composition at the bonding temperature (>60° C.).

In order to allow easy contact attachment (no protruding particles) and adhesive bonding over the full area without air inclusions, the conductive particles are chosen to be smaller than the layer of adhesive composition. In order, however, to produce conductivity in the z direction, the application of pressure at elevated temperature, and a certain viscosity of the adhesive composition at this temperature, is necessary, therefore, in order to displace the adhesive composition and to allow contact between conductive particles and substrate surfaces.

The problem which arises is that, on applying pressure, too great a quantity of adhesive composition is expressed, in which case the layer of adhesive composition would become too thin and the conductive particles would, furthermore, be damaged. A solution to this conflict is to use admixed spacer particles in addition. These particles provide for an accurate joint thickness on bonding and protect the soft particles against excessive application of pressure, which in the case of metallized polymer particles, for example, would lead to the destruction of the metal layer.

In order to prevent excessive deformation of the adhesive sheet, it is necessary to admix spacer particles and to do so in a proportion of 1–10% by weight (for an average bond area in the region of about 1 $cm^2$). The spacer particles are of spherical geometry and consist of a hard material which at the elevated bonding temperature does not melt and is non-deformable or virtually non-deformable. The spacer particles may likewise be conductive; however, they should be harder than the metallized particles. In addition they should have a smaller diameter than the conductive particles.

The thickness of the spacer particles corresponds approximately to the desired thickness of the layer of adhesive composition after applying pressure, or bonding. They therefore have a diameter which is slightly smaller than the thickness of the adhesive sheet. They permit precise adjustment of this thickness through the bonding process under temperature, pressure and the plane-parallelism of the press die, even if these bonding parameters fluctuate. The abovementioned spacers are preferably hard, pherical particles such as, for example glass beads. A metal layer on these particles is possible, although not necessary, since the soft metallized particles bring about sufficient conductivity, and a conductive system is therefore already present.

The adhesive sheet of the invention can be employed with particular advantage to implant electrical modules into a card body which is provided with a recess which is intended to accommodate an electronic module having on its first side a plurality of contact faces and on its second side, which is opposite to the first side, an IC chip whose terminals are connected via electrical conductors to the contact faces, the adhesive film being used to connect the second side of the module to the card body. Because of the reproducible thickness of the bonded joint, the module employed always finishes flush with the chip card surface and does not protrude. In addition, the electrically conductive adhesive film brings about an electrically conductive contact between the module and, for example, an antenna in the card body, without causing a short circuit.

Preferably, in this case, the adhesive sheet has the same dimensions as the module and is in the form of a punched section.

Furthermore, it is also possible to use the adhesive sheet for structural bonding, with or without subsequent heat curing.

To produce the adhesive sheet, the composition forming the sheet is cast as a solution onto a flexible substrate (release film or release paper) and is dried, so that the composition can easily be removed again from the substrate.

Following appropriate processing, punched sections or a roll of this adhesive sheet can be bonded to the adherend substrate (electronic component, module, etc.) at room temperature or at slightly elevated temperature.

The admixed reactive resins should not enter into any chemical reaction even at the slightly elevated temperature. Therefore, the bonding operation need not be carried out as a one-stage process; rather, for the sake of simplicity, it is possible, as with a pressure-sensitive adhesive (PSA) tape, first to attach the adhesive sheet to one of the two substrates by lamination with heat. Then, in the actual process of hot bonding to the second substrate, the resin cures partly or fully and the bonded joint attains the high bond strength, far above that of PSA systems. Accordingly, the adhesive sheet is particularly suitable for hot pressing at temperatures above 60° C., in particular from 120 to 200° C.

In contrast to adhesive pastes or liquid adhesives comprising conductive filler, which are usually suitable for isotropically conductive connection, however, the adhesive sheet described above does not cure to a brittle film but instead, owing to the balanced proportion of crosslinker resin and elastic rubber, remains in a viscoelastic state, as a result of which it is able effectively to withstand peel movements and peel stresses in particular. The great advantage of the adhesive film described is manifested wherever an adhesive bond or fastening and an electrically conducting connection have hitherto been effected in two separate steps. In the great majority of cases, this also means an increase in the space required for fastening and conductive connection, which in the case of relatively small electronic components is a disadvantage. Furthermore, the separate bonding step requires specific and expensive equipment.

The invention describes an electrically conductive, thermoplastic and heat-activatable adhesive sheet as used for the permanent connection of two articles. In contrast to adhesive bonds produced with a PSA tape, strengths as required in the construction sector are permanently achieved and are retained even under chemical, thermal or climatic stress.

The invention describes a product which achieves high strengths, is able to adapt to expansions and compressions of the bonded joint without becoming detached, contains particles which bring about the electrical conductivity, these particles likewise being able to adapt to mechanical stresses without losing the contact, can easily be contact-attached by means of a little heat, since there are no particles projecting from the adhesive composition, which would lead to air inclusions, after adhesive bonding under pressure gives a conductive connection without air inclusions (this is important since the included air bubbles which can be observed around the silverized particles under an optical microscope in particular can no longer be expelled by even relatively high pressure), always gives a uniform bonded joint of constant thickness, even under fluctuating processing parameters (pressure, temperature, plane-parallelism of the dies) as a result of admixed spacer particles.

The adhesive sheets of the invention therefore feature a range of advantages:

They possess high cohesion and elasticity at room temperature.

They exhibit a high level of adhesion to the conventional chip card materials such as PVC, PC, PET or ABS, for example.

They can be activated at below the softening temperature of the card materials.

They can be pressed together at a suitable processing temperature and pressure, as a result of which the thickness of the adhesive bond is below the thickness of the adhesive sheet employed.

They produce an electrical conductivity through admixed particles which are soft and yet harder than the adhesive composition at the bonding temperature.

They additionally include spacer particles which determine the minimum thickness of the adhesive joint so as not to bring about excessive deformation and damage to the conductive particles.

They can be processed on conventional processing machines for producing smart cards, as are offered by the companies Mühlbauer and Ruhlamat.

Furthermore, chip cards whose modules are bonded in using an adhesive sheet of the invention feature particularly high flexural strength. This is demonstrated by conducting a long-term flexural test under a constant load cycle in accordance with DIN EN 20 178, with subsequent functional testing.

In the text below, an example is used to illustrate the adhesive sheet of the invention, without wishing to restrict the described invention unnecessarily.

EXAMPLE 1

A typical adhesive sheet formulation in 30% strength solution in a mixture of ketones is admixed with the following conductivity and spacer particles and is dried in the form of an adhesive film on release paper. The adhesive sheet formulation has the following composition:

|  |  | % by weight |  |
|---|---|---|---|
| Nitrile rubber |  | 52 |  |
| Phenolic resin |  | 30 |  |
| Glass beads |  | 10 |  |
| Gold-coated polystyrene beads |  | 8 |  |
| Thickness of the dried adhesive sheet | $\mu$m | 60 | ASTM D 1000 |
| Weight of the adhesive sheet | g/m$^2$ | 58 | ASTM D 1000 |

The sheet is pressed to give a bonded joint of 45 $\mu$m by brief adhesive bonding at 190° C. for 1 second under a pressure of 60 N/cm$^2$, and gives the following results when tested:

| Contact resistance | m$\Omega$ | 3.5 | ASTM D 2739 |
|---|---|---|---|
| Specific resistance | $\Omega$m | 0.30 | ASTM D 2739 |
| Bond strength | N/mm$^2$ | 9.0 | DIN EN 1465 |

What is claimed is:

1. Electrically conductive, thermoplastic and heat-activatable adhesive sheet comprising a thermoplastic polymer in a proportion of at least 30% by weight, one or more tackifying resins in a proportion of from 5 to 50% by weight or epoxy resins with hardeners, with or without accelerators, in a proportion of from 5 to 40% by weight, or both;

metallized particles in a proportion of from 0.1 to 40% by weight, and substantially non-deformable spacer particles, in a proportion of from 1 to 10% by weight, which do not melt at the bonding temperature of the adhesive sheet.

2. The electrically conductive, thermoplastic and heat-activatable adhesive sheet according to claim 1, wherein the thermoplastic polymer comprises thermoplastic polyolefins, polyesters, polyurethanes or polyamides or modified rubbers.

3. The electrically conductive, thermoplastic and heat-activatable adhesive sheet according to claim 1, wherein the adhesive sheet has been blended with one or more additives.

4. The electrically conductive, thermoplastic and heat-activatable adhesive sheet according to claim 1, having a thickness of from 10 to 500 μm.

5. The electrically conductive, thermoplastic and heat-activatable adhesive sheet according to claim 1, wherein the conductive particles are metallized or conductive-polymer-coated metal or plastic beads.

6. The electrically conductive, thermoplastic and heat-activatable adhesive sheet according to claim 1, wherein the conductive particles have a greater diameter than the spacer particles.

7. The electrically conductive, thermoplastic and heat-activatable adhesive sheet according to claim 1, wherein the spacer particles are harder than the conductive particles.

8. The electrically conductive, thermoplastic and heat-activatable adhesive sheet according to claim 1, suitable for hot pressing at temperatures above 60° C.

9. The electrically conductive, thermoplastic and heat-activatable adhesive sheet according to claim 1, having the same dimensions as an electrical module to be implanted in a card body and being in the form of a punched section.

10. The electrically conductive, thermoplastic and heat-activatable adhesive sheet according to claim 1, wherein the diameter of the spacer particles is slightly smaller than the thickness of the adhesive sheet.

11. The electrically conductive, thermoplastic and heat-activatable adhesive sheet according to claim 1, wherein the spacer particles are of spherical geometry.

12. A method for implanting electrical modules into a card body which is provided with a recess is intended to accommodate an electronic module which has on its first side a plurality of contact faces and on its second side, which is opposite to the first side, an IC chip whose terminals are connected via electrical conductors to the contact faces, which comprises connecting the second side of the module to the card body with the adhesive sheet claim 1.

13. A method of structural bonding, which comprises bonding with the adhesive sheet of claim 1, with or without-subsequent heat curing.

14. The electrically conductive, thermoplastic and heat-activatable adhesive sheet of claim 2, wherein said thermoplastic polymer is nitrile rubber.

15. The electrically conductive, thermoplastic and heat-activatable adhesive sheet of claim 3, wherein said one or more additives are selected from the group consisting of colorants, mineral fillers and organic fillers.

16. The electrically conductive, thermoplastic and heat-activatable adhesive sheet of claim 15, wherein said additive is silica, carbon powder or metal powder.

17. The electrically conductive, thermoplastic and heat-activatable adhesive sheet according to claim 1, wherein the sheet is defined by a x, y and z plane and wherein the conductivity extends only in z direction.

* * * * *